(12) United States Patent
Altuner et al.

(10) Patent No.: US 6,171,133 B1
(45) Date of Patent: Jan. 9, 2001

(54) CONTACT-MAKING DEVICE

(75) Inventors: Turgay Altuner, Frankfurt; Birgit Möller, Mühlacker/Lomersheim, both of (DE)

(73) Assignee: Mannesmann VDO AG, Frankfurt (DE)

( * ) Notice: Under 35 U.S.C. 154(b), the term of this patent shall be extended for 0 days.

(21) Appl. No.: 09/364,404

(22) Filed: Jul. 30, 1999

(30) Foreign Application Priority Data

Aug. 6, 1998 (DE) .............................................. 198 35 517

(51) Int. Cl.[7] .......................... H01R 12/00; H01R 13/64; H01R 13/73; H05K 1/00
(52) U.S. Cl. ......................... 439/381; 439/79; 439/374; 439/572
(58) Field of Search .............................. 439/79, 374, 378, 439/381, 567, 571, 572

(56) References Cited

U.S. PATENT DOCUMENTS 4,875,863 * 10/1989 Reed ........................................ 439/79
5,186,633 * 2/1993 Mosser, III ............................. 439/79
5,240,422 * 8/1993 Kobayashi et al. ..................... 439/78
5,468,154 * 11/1995 Yip et al. ................................ 439/79
5,980,314 * 11/1999 Roberts ................................. 439/567
6,033,258 * 3/2000 Huang et al. ...................... 439/541.5

FOREIGN PATENT DOCUMENTS 0702432    3/1996  (EP) .

* cited by examiner

*Primary Examiner*—Paula Bradley
*Assistant Examiner*—Edwin A. León
(74) *Attorney, Agent, or Firm*—Martin A. Farber

(57) ABSTRACT

In a contact-making device having a connector strip (1) that is to be fixed on a circuit board (2), a guide plate (3) is arranged between the circuit board (2) and the connector strip (1). The guide plate (3) has cutouts (8) for contact legs (7) of the connector strip (1) and aligns the latter relative to holes (9) in the circuit board (2). The mounting of the contact-making device is configured in a particularly simple manner as a result of this.

9 Claims, 3 Drawing Sheets

CONTACT-MAKING DEVICE

FIELD AND BACKGROUND OF THE INVENTION

The invention relates to a contact-making device having a connector strip and having a plurality of contact legs which project from the connector strip and are to be inserted into holes in a circuit board in the course of the connector strip being mounted on said circuit board.

Such contact-making devices are frequently used for example for supplying control units or electrical components with electrical energy or signals in motor vehicles, and are known from the art. The control units or the electrical components either form a structural unit with the connector strip or can be connected thereto. The contact legs of the known contact-making device project from the connector strip and are inserted into the holes in the circuit board for the purpose of mounting. In the mounted state of the contact-making device, the contact legs penetrate through the circuit board, where they are soldered to conductor tracks arranged on the circuit board. As a result of this, the connector strip is fixed on the circuit board and, at the same time, has contact made with it.

The known contact-making device has the disadvantage that it is very complicated to mount since even slight deviations of the usually very thin contact legs from their intended position lead to them kinking when the connector strip is mated to the circuit board. Particularly in the case of the large number of contact legs of the connector strip for a control unit in a motor vehicle, the known contact-making device can, therefore, usually be mounted only manually.

SUMMARY OF THE INVENTION

A The invention is based on the problem of configuring a contact-making device of the type mentioned in the introduction in such a way that it can be mounted in a particularly simple manner and the risk of the contact legs kinking is minimized.

This problem is solved according to the invention by virtue of the fact that the connector strip has a guide plate, which is provided with cutouts for guiding the contact legs and can be displaced along the contact legs in the course of mounting.

This configuration makes it possible firstly to connect the guide plate to the contact legs in the course of the mounting of the connector strip on the circuit board. In the process, the contact legs penetrate the accurately fitting cutouts in the guide plate and are aligned relative to the holes in the circuit board. Individual contact legs are thereby reliably prevented from kinking as they are inserted into the holes in the circuit board. By virtue of the invention, the mounting of the connector strip on the circuit board is configured in a particularly simple manner. Moreover, the mounting can be automated. The guide plate may have particularly small dimensions in relation to the connector strip and to the circuit board, with the result that the contact legs can be inserted into the cutouts in the guide plate in a very simple manner.

In accordance with one advantageous development of the invention, the guide plate can be aligned relative to the circuit board in a very simple manner if the guide plate has guide elements provided for penetrating cutouts in the circuit board.

A contribution is made to further simplifying the mounting of the contact-making device according to the invention if the connector strip can be connected to the guide plate to form a premountable unit in which the ends of the contact legs lie approximately in one plane together with that surface of the guide plate which faces the circuit board.

In accordance with another advantageous development of the invention, the connector strip can be aligned relative to the guide plate in a particularly simple manner if the guide elements of the guide plate are of sleeve-type configuration and if the connector strip has guide pins designed for penetrating the guide elements.

In accordance with another advantageous development of the invention, the connector strip can be connected to the guide plate with a particularly low expenditure of force if on their inner sides, the sleeve-type guide elements of the guide plate are configured such that they taper toward the side facing the circuit board.

In accordance with another advantageous development of the invention, the guide elements of the guide plate are braced in the cutouts in the circuit board when the connector strip is mated to the circuit board if, at their ends facing the circuit board, the internal diameter of the sleeve-type guide elements is smaller than the diameter of the guide pins of the connector strip, and if the guide elements have a longitudinally slotted configuration. The contact-making device according to the invention has particularly high stability as a result of this.

In accordance with another advantageous development of the invention, a contribution is made to further simplifying the connection of the connector strip to the guide plate if the guide pins are configured such that they taper toward their free ends.

In accordance with another advantageous development of the invention, the premounted state of the connector strip and the guide plate is defined particularly exactly if the guide pins each have a notch and the sleeve-type guide elements have lugs penetrating the notch in the premounted state of the connector strip and guide plate. This contributes to further simplifying the mounting of the contact-making device according to the invention.

The connector strips which are provided for connecting control units of a motor vehicle, in particular, themselves frequently bear plug-in connections onto which connectors for signal lines are plugged. In the case of these connector strips, it is important that force influences always act perpendicularly on the circuit board, in order to avoid subjecting the circuit board to unnecessary mechanical stresses. In accordance with another advantageous development of the invention, the connector strip is reliably aligned in an intended position after mounting on the circuit board if the guide plate and/or the connector strip have/has spacers provided for bearing on the circuit board.

In accordance with another advantageous development of the invention, a contribution is made to further simplifying the mounting of the connector strip on the guide plate if the cutouts for the contact legs in the guide plate have a funnel-shaped configuration on the side facing the connector strip.

As a rule, the contact legs have angular portions leading to the holes in the circuit board. In accordance with another advantageous development of the invention, these angular portions do not result in an increase in the distance between the connector strip and the circuit board if the guide plate has grooves for accommodating angular portions of the contact legs.

BRIEF DESCRIPTION OF THE DRAWINGS

The invention allows numerous embodiments. In order to further elucidate its basic principle, one of said embodiments is illustrated in the drawings and is described below. In the drawings.

DETAILED DESCRIPTION OF THE PREFERRED EMBODIMENT

Figure 1:
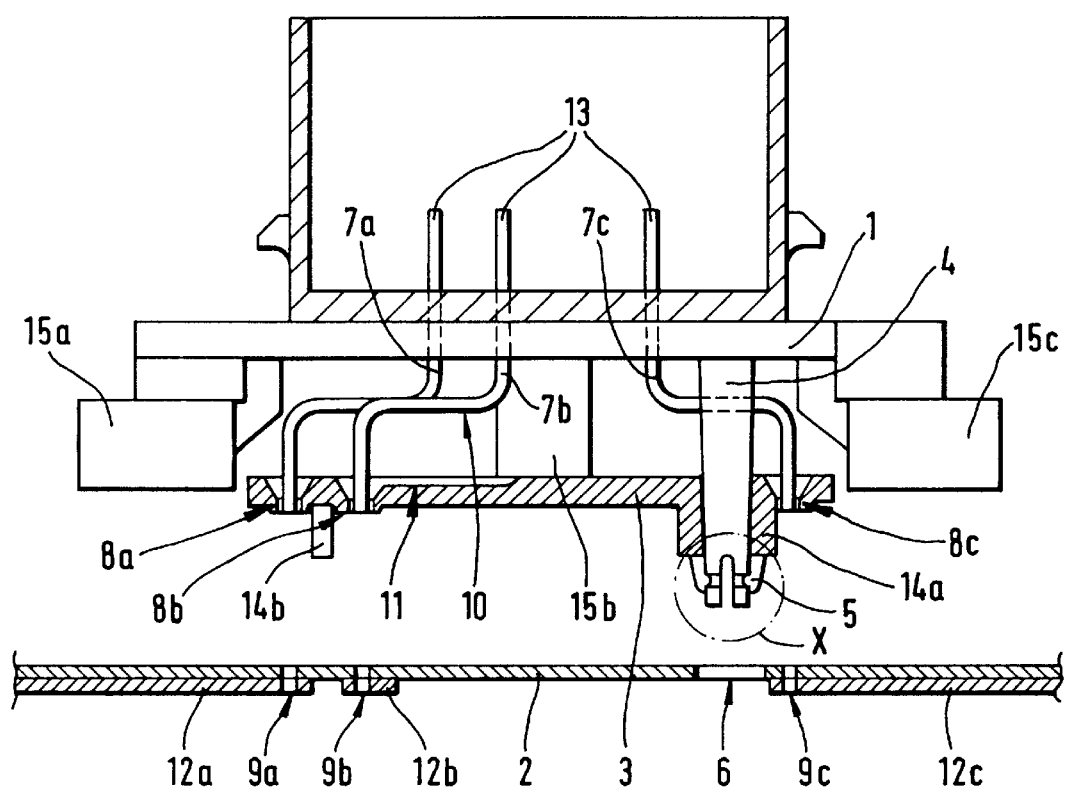
FIG. 1 shows a partial section through a contact-making device according to the invention in the course of mounting.

FIG. 1 shows a contact-making device according to the invention, having a connector strip 1 that is to be mounted on a circuit board 2. The connector strip 1 forms a premounted structural unit with a guide plate 3. The connector strip 1 has guide pins 4, only one of which is illustrated in order to simplify the drawing. The guide pin 4 penetrates a sleeve-type guide element 5 of the guide plate 3 and is latched to the latter in the position illustrated. The external dimensions of the sleeve-type guide element 5 correspond to those of a cutout 6 in the circuit board 2. Furthermore, the connector strip 1 has a plurality of contact legs 7a–7c, which penetrate cutouts 8a–8c in the guide plate 3. The cutouts 8a–8c in the guide plate 3 have a funnel-shaped configuration and serve for guiding the contact legs 7a–7c. By this means, the contact legs 7a–7c are aligned relative to holes 9a–9c arranged in the circuit board 2. Furthermore, the guide plate 3 has grooves 11, which are configured in a manner corresponding to angular portions 10 of the contact legs 7b. On its side remote from the connector strip 1, the circuit board 2 has a plurality of conductor tracks 12a–12c. Three contact legs are illustrated in the drawing in a manner representative of a multiplicity of contact legs 7a–7c. The contact legs 7a–7c each lead to plug contacts 13.

By way of example, the circuit board 2 may be provided as part of a controller of a motor vehicle and the connector strip 1 may be provided for connecting a connector for signal lines or for power supply lines of the controller.

Furthermore, FIG. 1 shows that spacers 14a, 14b, 15a–15c are respectively arranged on the connector strip 1 and guide plate 3. These spacers 14a, 14b, 15a–15c bear on the circuit board 2 in the mounted state. In this case, the spacers 15a–15c simultaneously serve for fixing to the circuit board 2.

Figure 2:
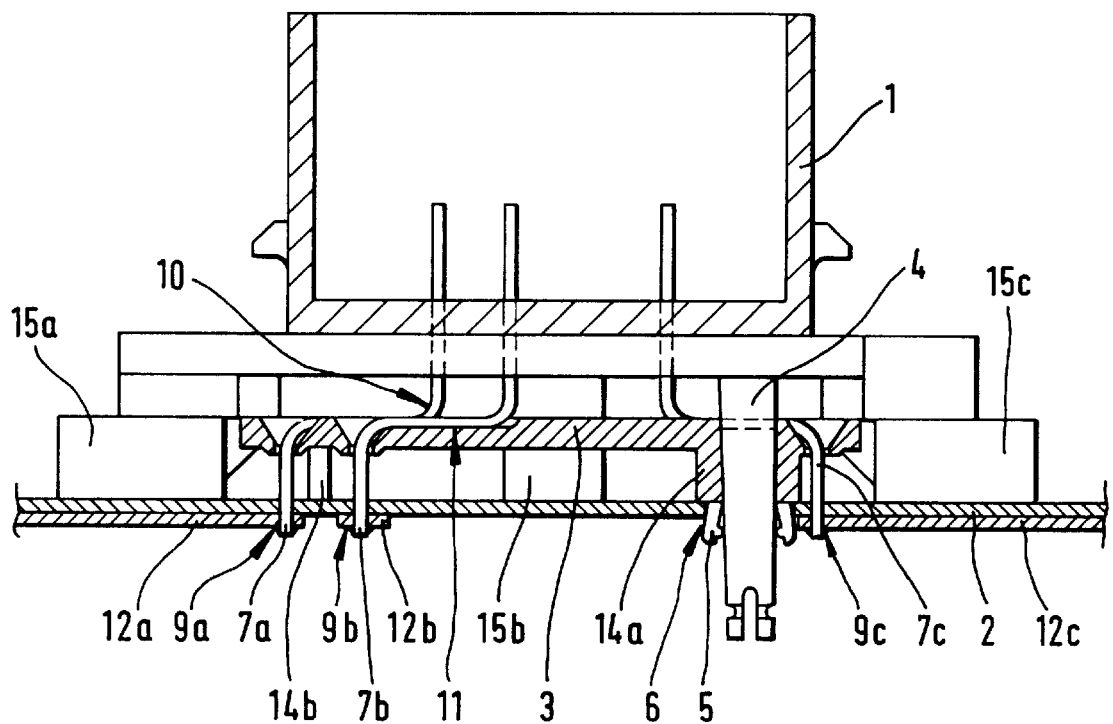
FIG. 2 shows the contact-making device from FIG. 1 after mounting.

FIG. 2 shows the contact-making device according to the invention from FIG. 1 in the mounted state. The contact legs 7a–7c penetrate through the circuit board 2 in the region of the holes 9a–9c and are soldered to the conductor tracks 12a–12c. Furthermore, the sleeve-type guide element 5 is braced in the cutout 6 in the circuit board 2. This ensures high mechanical stability of the contact-making device. The angular portions 10 of the contact legs 7b are situated in the grooves 11 in the guide plate 3.

Figure 3:
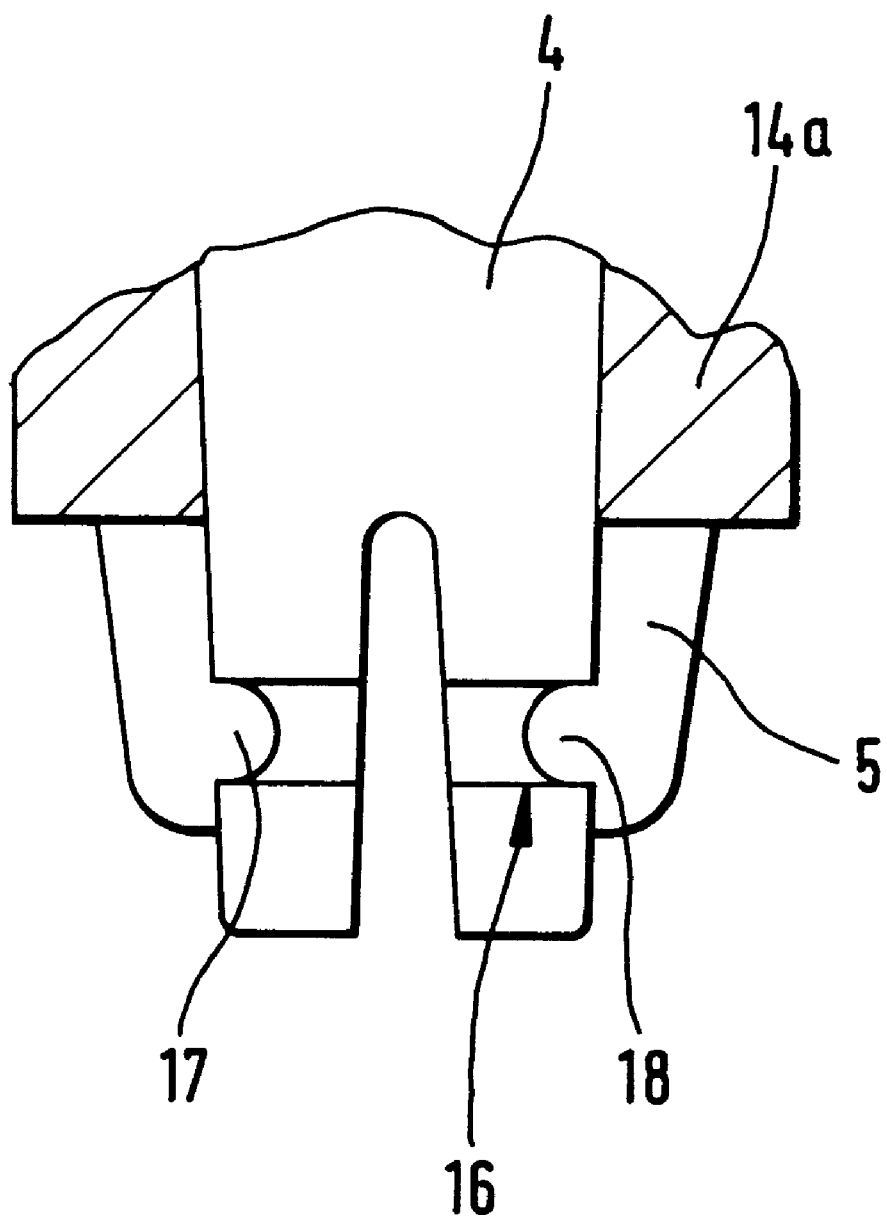
FIG. 3 shows a greatly enlarged illustration of the detail "X" from FIG. 1.

FIG. 3 illustrates the detail "X" from FIG. 1 in a greatly enlarged illustration. In this case, it is possible to discern the latching of the guide pin 4 in the sleeve-type guide element 5. The guide pin 4 of the connector strip 1 has a peripheral notch 16, and the sleeve-type guide element 5 has lugs 17, 18 penetrating the notch 16. Furthermore, the sleeve-type guide element 5 is longitudinally slotted, with the result that it can spread radially outward during the insertion of the guide pin 4.

What is claimed is:

1. A contact-making device having a connector strip and having a plurality of contact legs which project from the connector strip and are to be inserted into holes in a circuit board in the course of the connector strip being mounted on said circuit board, wherein the connector strip (1) has a guide plate (3), which is provided with cutouts (8a–8c) for guiding the contact legs (7a–7c) and can be displaced along the contact legs (7a–7c) in the course of mounting; and wherein the guide plate has guide elements extending therefrom, the guide elements being of sleeve-type configuration, and wherein the connector strip has guide pins designed for penetrating the guide elements.

2. The contact-making device as claimed in claim 1, wherein the guide plate (3) has guide elements (5) provided for penetrating cutouts (6) in the circuit board (2).

3. The contact-making device as claimed in claim 1, wherein the connector strip can be connected to the guide plate (3) to form a premountable unit in which the ends of the contact legs (7a–7c) lie approximately in one plane together with that surface of the guide plate (3) which faces the circuit board (2).

4. The contact-making device as claimed in claim 1, wherein, at their ends facing the circuit board, the internal diameter of the sleeve-type guide elements is smaller than the diameter of the guide pins of the connector strip, and wherein the guide elements have a longitudinally slotted configuration.

5. The contact-making device as claimed in claim 1, wherein the guide plate (3) and/or the connector strip (1) have/has spacers (14a, 14b, 15a–15c) provided for bearing on the circuit board (2).

6. The contact-making device as claimed in claim 1, wherein the cutouts (8a–8c) for the contact legs (7a–7c) in the guide plate (3) have a funnel-shaped configuration on the side facing the connector strip (1).

7. The contact-making device as claimed in claim 1, wherein the guide plate (3) has grooves (11) for accommodating angular portions (10) of the contact legs (7a–7c).

8. The contact-making device as claimed in claim 1, wherein, on their inner sides, the sleeve-type guide elements of the guide plate are configured such that they taper toward the side facing the circuit board.

9. The contact-making device as claimed in claim 8, wherein that their ends facing the circuit board (2), the internal diameter of the sleeve-type guide elements (5) is smaller than the diameter of the guide pins (4) of the connector strip (1), and wherein the guide elements (5) have a longitudinally slotted configuration.

* * * * *